United States Patent [19]

Park et al.

[11] Patent Number: 6,043,000
[45] Date of Patent: Mar. 28, 2000

[54] METHOD FOR MANUFACTURING A SEMICONDUCTOR DEVICE

[75] Inventors: Yong-Seok Park; Jong-Woo Son, both of Kyung Sang Buk Do, Rep. of Korea

[73] Assignee: LG Electronics, Seoul, Rep. of Korea

[21] Appl. No.: 08/799,416

[22] Filed: Feb. 12, 1997

[30] Foreign Application Priority Data

Jun. 12, 1996 [KR] Rep. of Korea ..................... 96-21099

[51] Int. Cl.[7] ........................................ G03F 7/00
[52] U.S. Cl. ........................ 430/318; 430/319; 430/396
[58] Field of Search .................... 430/318, 314, 430/312, 319, 316, 323, 396; 438/30, 947

[56] References Cited

U.S. PATENT DOCUMENTS 5,731,109  3/1998  Hwang ........................................ 430/5

FOREIGN PATENT DOCUMENTS

| 0500456 | 8/1992 | European Pat. Off. . |
| 3823463 | 1/1900 | Germany . |
| 4-040457 | 2/1992 | Japan . |
| 567550 | 3/1993 | Japan . |
| 7-028074 | 1/1995 | Japan . |

*Primary Examiner*—John A. McPherson

[57] ABSTRACT

A method for manufacturing a liquid crystal display, includes the steps of forming a first metal layer on a transparent substrate, forming a first photo-resist pattern on the first metal layer by using a first mask with a predetermined pattern, forming a gate electrode by etching the first metal layer using the first photo-resist pattern, forming a second metal layer over the gate electrode, forming a second photo-resist pattern on the second metal layer by using a second mask having a line-and-space pattern whose space width is smaller than a resolution of an exposure system, forming source and drain electrodes by etching the second metal layer using the second photo-resist pattern, and forming a transparent conductive material layer for electrically connecting the drain electrode with a pixel electrode.

12 Claims, 8 Drawing Sheets

METHOD FOR MANUFACTURING A SEMICONDUCTOR DEVICE

BACKGROUND OF THE INVENTION

1. Field of the Invention

The present invention relates to a method for manufacturing active matrix liquid crystal displays (AMLCDs), and more particularly to a method for manufacturing AMLCDs which can prevent disconnection of signal lines and short circuit by improving the step coverage of the liquid crystal displays (LCDs) having a layered structure.

2. Description of the Related Art

In conventional AMLCDs, switching devices having integrated active elements such as thin film transistors (TFTs) are used to drive and control pixels in the LCDs. As shown in FIG. 1, a conventional LCD with TFT arrays has rectangular pixel electrodes 12 arrayed in rows and columns on a transparent substrate 11. Each of gate lines (address lines) 13 is formed between the rows of the pixel electrodes 12, and each of source lines (data lines) 14 is formed between the columns of the pixel electrodes 12. The TFTs 15 are electrically connected with the gate lines 13 and source lines 14, in the vicinity of an intersection between the gate lines 13 and the source lines 14.

FIG. 2A shows a plan view of a part of liquid crystal display elements of the conventional LCD, and FIG. 2B shows a sectional view taken along line 2B—2B in FIG. 2A.

Referring to FIGS. 2A and 2B, the conventional LCD includes a TFT array, a gate line 13 and a gate electrode 13a formed on a transparent glass substrate 11. An insulating layer 21 is formed to cover the gate electrode 13a and a gate bus line 13b formed on the transparent substrate 11. A source line 14 is formed across the gate line 13 on the insulating layer 21. Near each crossing point where the gate and source lines 13 and 14 cross each other, an intrinsic semiconductor layer 16 is formed on the gate electrode 13a branched out of the gate line 13. The insulating layer 21 is formed between the semiconductor layer 16 and the gate electrode 13a. A source electrode 14a which is branched out from the source bus line 14 is formed on a portion of the intrinsic semiconductor layer 16 over one side of the gate electrode 13a. A drain electrode 17 is formed over another side of the gate electrode 13a, opposite the source electrode 14a. In this manner, the TFTs having non-linear active elements are formed, in which the source and drain electrodes respond in accordance with the charges applied to the corresponding gate electrode.

An n$^+$ semiconductor layer 22 is formed on the intrinsic semiconductor layer 16, and the source electrode 14a and the drain electrode 17, both made of metal, are formed thereon. The source and drain electrodes 14a and 17, respectively, are ohmic-contacted with the impure semiconductor layer 22.

In the TFT, as shown in FIG. 2B, the drain electrode 17 having an ohmic contact with the n+ semiconductor layer 22 is electrically connected with a pixel electrode 12 through a contact hole 19 formed in an insulating passivation layer 25. Basically, such a TFT includes the gate electrode 13a, the insulating layer 21, the intrinsic semiconductor layer 16, the impure semiconductor layer 22, the drain electrode 17 and the source electrode 14a. All of them are formed by repeating the steps of thin film-depositing, exposing and developing photo-resist by using masks and etching.

The aforementioned conventional AMLCD has a layered structure, in which each element thereof is formed of a thin layer. As the thin layers are piled up, overlapping portions are formed at each crossing area where the gate and source lines cross, and at areas where the drain electrodes are connected with the pixel electrodes on the TFTs arranged in rows and columns on the substrate.

Generally, a shape of one layer affects the shape of any other layer formed thereon. For example, if the shape of a first formed layer has a reversed taper and/or a shoulder, a second thin layer formed thereon will replicate the formed layer. That is, when a first metal layer has a reversed taper portion and/or a shoulder, an insulating layer formed thereon will replicate the formed layer in manufacturing an LCD. Consequently, any metal layer formed on such insulating layer has disconnected lines or short circuit problems.

These problems frequently occur when a thin film is formed with metals (e.g., Cr) which are hard to etch into a predetermined pattern, e.g., a tapering shape, or when a dry-etching method is used in the patterning process. In other words, the shape of a taper in a metal layer from which a drain electrode is formed determines the shape of an insulating passivation layer formed on the drain electrode, and affects the shape of a pixel electrode formed on the insulating passivation layer. The insulating passivation layer can have a desired shape only when the taper of the metal layer has a desired shape. Further, disconnection in the pixel electrode, resulting from a level difference (steps) within the drain electrode, can be prevented if the insulating passivation layer has a desired shape.

In the case where a metal layer for the drain electrode 17 is etched in a reverse-tapered shape (FIG. 3B), the insulating passivation layer 25 is formed with a shoulder 27 or possibly with a crack. Then the thin pixel electrode 12 is either disconnected or cannot be formed in a desired shape on the shoulder 27 or the crack. Moreover, when the insulating passivation layer 25 has cracks, etchant flows into the drain electrode 17 through the cracks and easily disconnects the drain electrode 17 during the etching step for forming the pixel electrode.

FIG. 3A shows an example of a disconnected line resulting from the above-mentioned shoulders or cracks and FIG. 3B shows a cross-sectional view taken along line 3B—3B of FIG. 3A.

As shown in FIGS. 3A and 3B, the drain electrode 17 has a reverse-tapered end. The insulating passivation layer 25 formed on the drain electrode 17 has a shoulder 27, and the pixel electrode 12 on the passivation layer 25 is disconnected where the step is formed in the passivation layer 25. This results in malfunctions and unreliable signal processing.

Therefore, in a layered structure, a good step-coverage is required for stable processing and for obtaining good manufacturing yield. However, it is very difficult to develop and manage a process for shaping a metal layer in a desired manner, after the metal layer is etched. It is also difficult to etch a thin layer made of a metal, such as Cr, to have a fine taper. Similarly, thin layers formed using a dry-etching method cause the layers to be disconnected or cause the layers to form cracks in other thin layers formed thereon. These and other problems arising from the conventional methods decrease yield in manufacturing semiconductor devices such as TFTs.

SUMMARY OF THE INVENTION

An object of the present invention is to provide a method for manufacturing a liquid crystal display in which a step-coverage in a thin-film layered structure is modified to prevent disconnection of signal lines.

Another object of the present invention is to provide a method of manufacturing a liquid crystal display which overcomes problems and disadvantages of related art.

In order to achieve these and other objects, a manufacturing method according to the present invention includes the steps of forming a first metal layer on a layer, coating photo-resist on the first metal layer, exposing and developing the photo-resist by using a mask with a lin-and-space pattern having a space width smaller than a resolution of an exposure system, etching the first metal layer into a desired pattern, forming an insulating layer on the patterned first metal layer, and forming a second metal layer on the insulating layer.

When the photo-resist formed on the first metal layer is exposed by using the mask with a comb-shaped line-and-space pattern, a first portion (P1) of the photo-resist corresponding to a space between the lines in the mask is exposed to less degree than a second portion (P2) of the photo-resist not covered by the mask. Similarly, a third portion (P3) of the photo-resist under the lines of the mask is lightly exposed, compared to the portion of the photo-resist without the mask. Thus degree of exposure in the photo-resist is P2>P1>P3. Each space width of the lines in the mask (i.e., the distance between the lines) is less than 2 $\mu$m.

The first metal layer is etched by using the photo-resist as a mask. The portion of the first metal layer having no photo-resist thereon is etched more quickly than the other portion of the first metal layer having the photo-resist thereon, because it takes much more time for the etchant to penetrate through the photo-resist. Likewise, the portion of the first metal layer having a thin layer of photo-resist thereon is etched more quickly than the portion of the first metal layer having a thicker layer of photo-resist.

Accordingly, the portion of the first metal layer, which is covered with a photoresist having line-and space patterns, is etched to have a furrow and ridge shape with a gentle slope, and not a step shape with an abrupt end.

When the insulating layer is formed on the above first metal layer, it also has a gentle slope corresponding to the slope of the first metal layer. The second metal layer formed on the insulating layer follows the gentle slope of the insulating layer.

Where the above-mentioned method is applied to forming the crossing-points of gate and source lines, the first layer is a transparent glass substrate, the first metal layer is a gate line, and the second metal layer is a source line. When the above-mentioned method is applied to manufacturing a TFT, the first metal layer is selected to be source and drain electrodes, and the second metal layer is a pixel electrode or a conductive layer for connecting the drain electrode with the pixel electrode. The above-mentioned method can be applied to both forming the crossing-points and manufacturing the TFT.

A method for manufacturing an LCD according to the present invention is describe below. A first metal layer is formed on a transparent glass substrate by depositing a metal. A photo-resist is coated on the first metal layer, and the photo-resist is exposed and developed by using a mask having a desired pattern. Gate lines and gate electrodes are formed by etching the first metal layer. An insulating layer is formed on the substrate including the gate electrodes and gate lines. An i-semiconductor layer is formed on the insulating layer. An n$^+$ semiconductor layer is formed on the i-semiconductor layer. A second metal layer is formed on the n+semiconductor. A photo-resist is coated on the second metal layer, and the photo-resist is exposed and developed by using a mask having a line-and-space pattern. The width of the space in the line-and-space pattern is smaller than an resolution of the exposure system. Source and drain electrodes are formed by etching the second metal layer. An insulating passivation layer is formed on the source and drain electrodes. A contact hole is formed in the insulating passivation layer. A conductive layer is formed on the insulating passivation layer. The conductive layer electrically connects the drain electrode to a pixel electrode.

The present invention is more fully described below with reference to preferred embodiments.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a method for manufacturing a semiconductor device, including the steps of forming a first metal layer on a layer; forming a photo-resist pattern on the first metal layer using a mask, the mask having a line-and-space pattern whose space width si smaller than a resolution of an exposure system; and patterning the first metal layer using the photo-resist pattern so as to form a first metal pattern corresponding to the photo-resist pattern.

Furthermore, the present invention is directed to a method for manufacturing a liquid crystal display, including the steps of forming a first metal layer on a transparent substrate, forming a first photo-resist pattern on the first metal layer by using a first mask with a predetermined pattern, forming a gate electrode by etching the first metal layer using the first photo-resist pattern, forming a second metal layer on the gate electrode, forming a second photo-resist pattern on the second metal layer by using a second mask having a line-and-space pattern whose space width is smaller than a resolution of an exposure system, forming source and drain electrodes by etching the second metal layer using the second photo-resist pattern, and forming a transparent conductive layer for electrically connecting the drain electrode with a pixel electrode.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

FIGS. 4A to 4I show for cross-sectional views of an LCD for explaining a method of manufacturing a TFT on a transparent glass substrate of an LCD according to the embodiments of the present invention.

Figure 1:
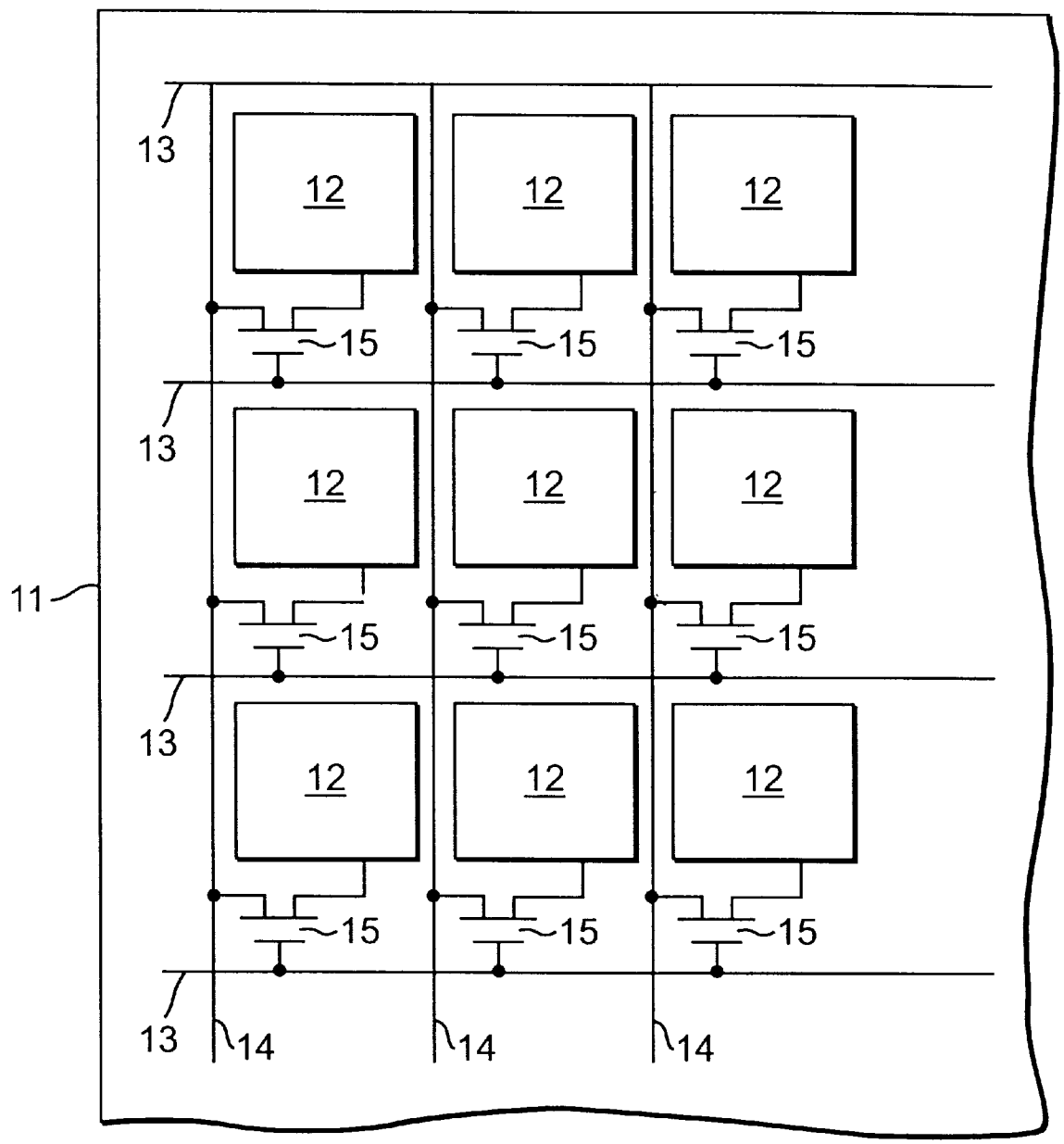
FIG. 1 is a circuit diagram of a conventional LCD.
Figure 2A:
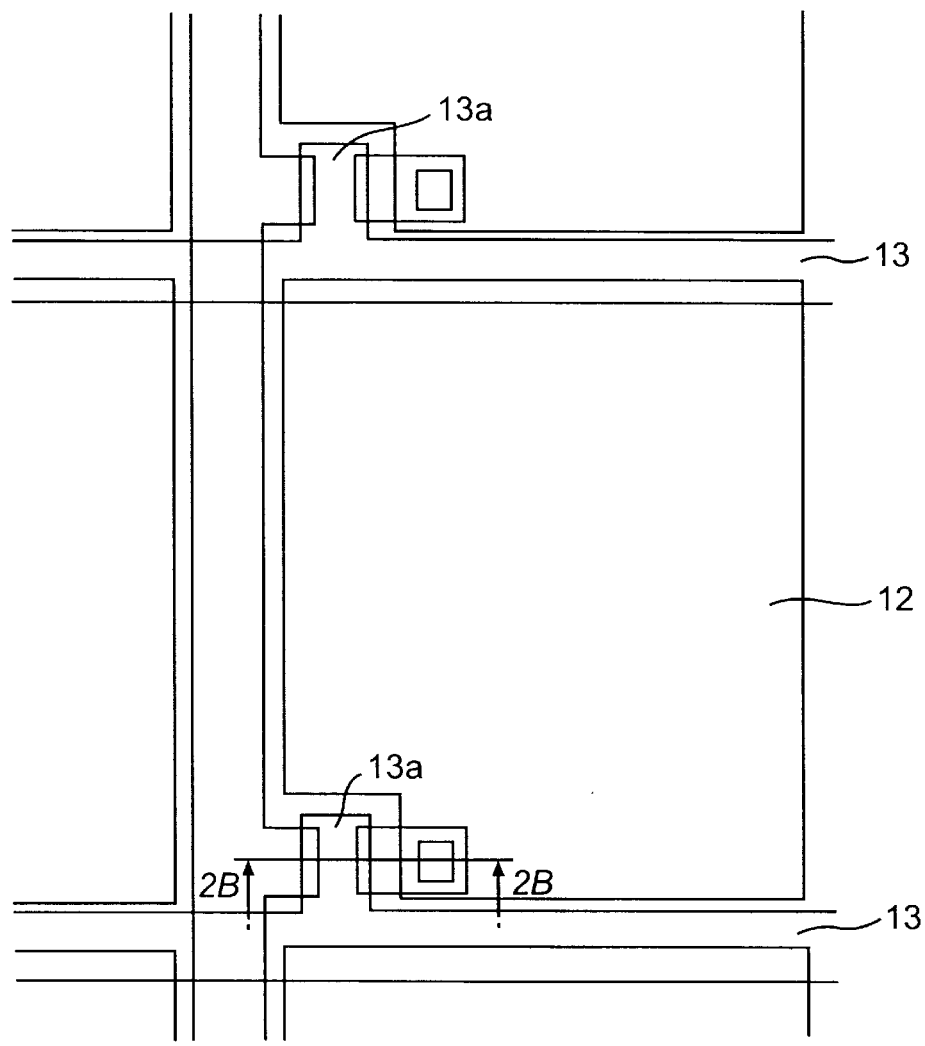
FIG. 2A is a plan view showing a portion of liquid crystal display elements of a conventional LCD having thin film transistor array.
Figure 2B:
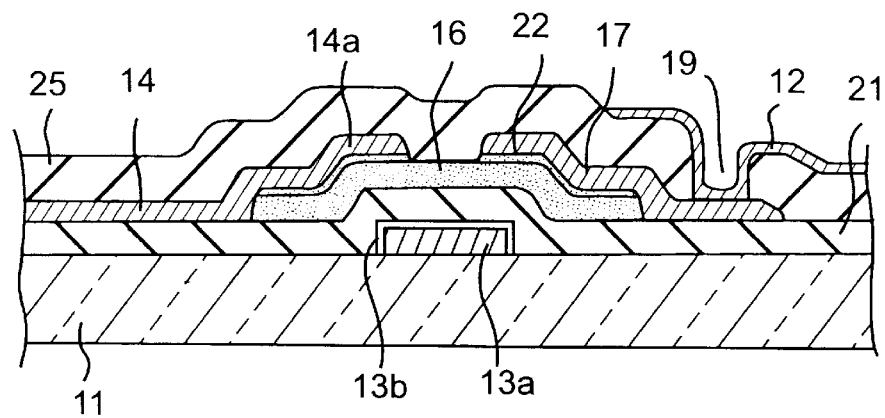
FIG. 2B is a cross-sectional view taken along line 2B—2B of FIG. 2A.
Figure 3A:
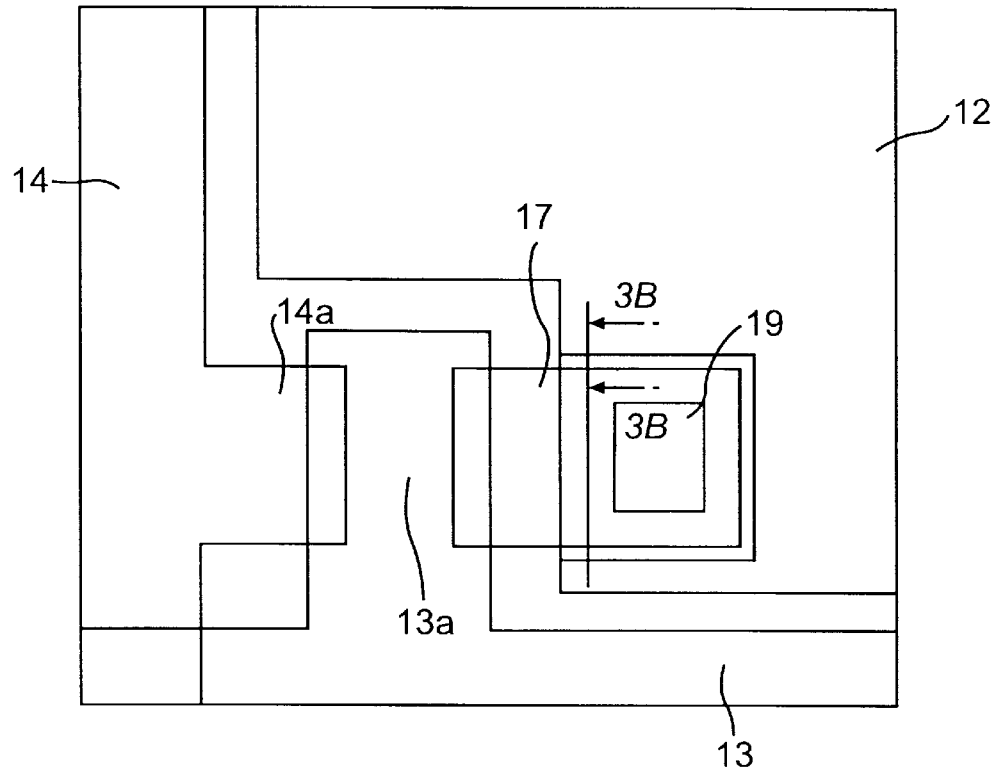
FIG. 3A is a plan view showing disconnected line resulting from photo-etching.
Figure 3B:
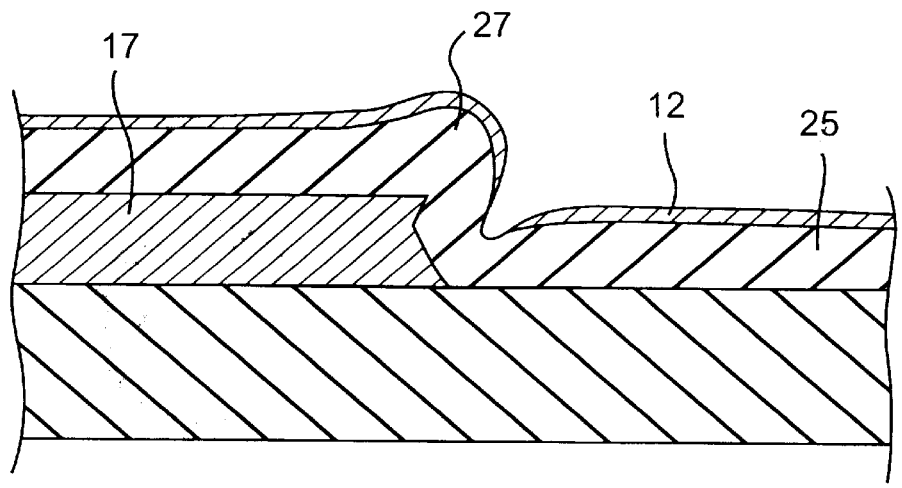
FIG. 3B is a cross-sectional view taken along line 3B—3B of FIG. 3A.
Figure 4A:
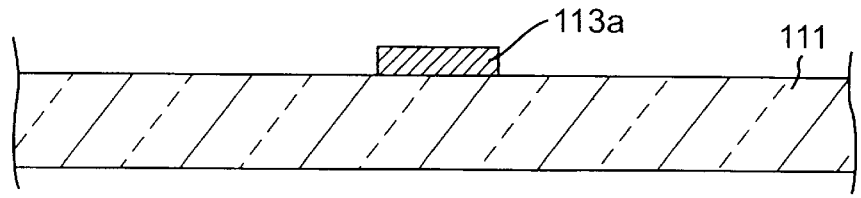
FIGS. 4A to 4I are cross-sectional views showing a manufacturing process for TFTs of an LCD according to the embodiments of the present invention.

A first metal layer of about 4000 Å thick is formed by sputtering a metal on a transparent glass substrate 14. The material is selected from aluminum (Al) and Al alloys such as Al—Pd, Al—Si, Al—Si—Ti and Al—Si—Cu. A gate electrode 113a is formed by etching the first metal layer, using photolithography (FIG. 4A).

Figure 4B:
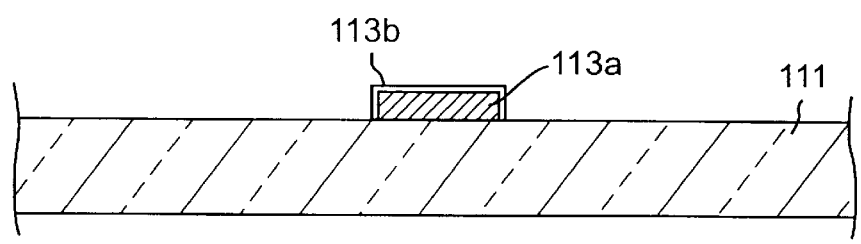

An anodized layer 113b is formed on the gate electrode 113a by anodizing the gate electrode 113a to improve its surface properties. The gate electrode 113a together with the anodized layer 113b becomes, then, chemical-resistant, heat-resistant and compatible to a gate insulating layer in terms of adhesion. The anodized layer 113b functions as an insulating layer together with a gate insulating layer, and thus improves insulation between the gate electrode 113a and other signal lines (FIG. 4B).

Figure 4C:
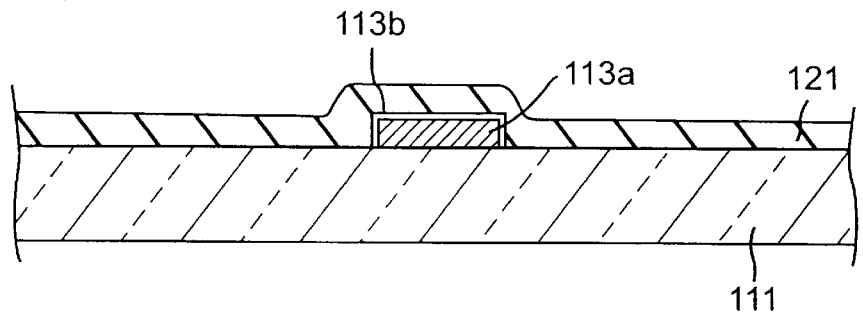

A gate insulating layer 121 made of Si-nitride is formed on the transparent glass substrate 111 including the gate electrode 113a by using a gas mixture of an ammonia, silane or nitrogen in a plasma CVD (chemical vapor deposition) system (FIG. 4C). The thickness of the gate insulating layer 121 is 2,000 Å.

Figure 4D:
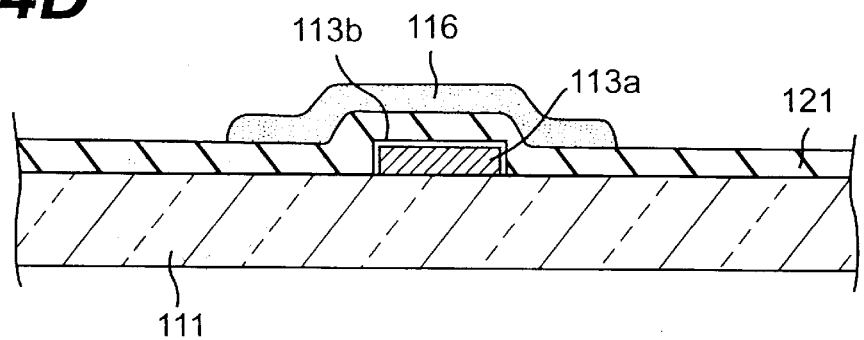
Figure 4E:
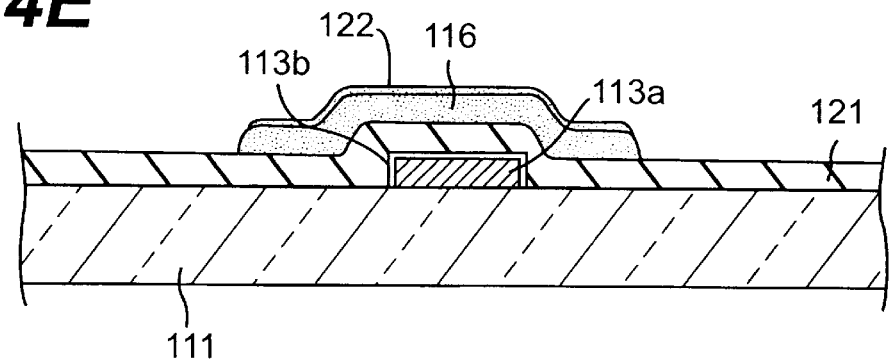

An i-semiconductor layer 116 of 2,000 Å thickness is formed on the insulating layer 121 by using a gas mixture of ammonia, silane, hydrogen in a CVD system (FIG. 4D). An n$^+$ semiconductor layer 122 of 3,000 Å thickness is formed on the i-semiconductor layer 116 by using a gas mixture of hydrogen, phosphine, etc. in a plasma CVD system (FIG. 4E).

Figure 4F:
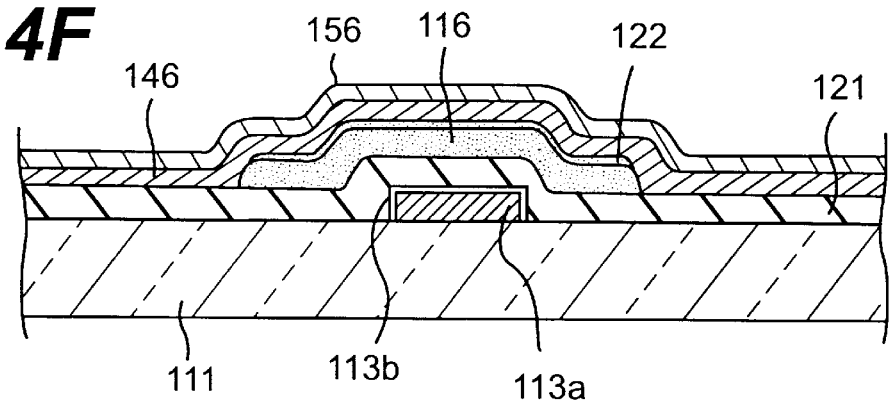
Figure 4G:
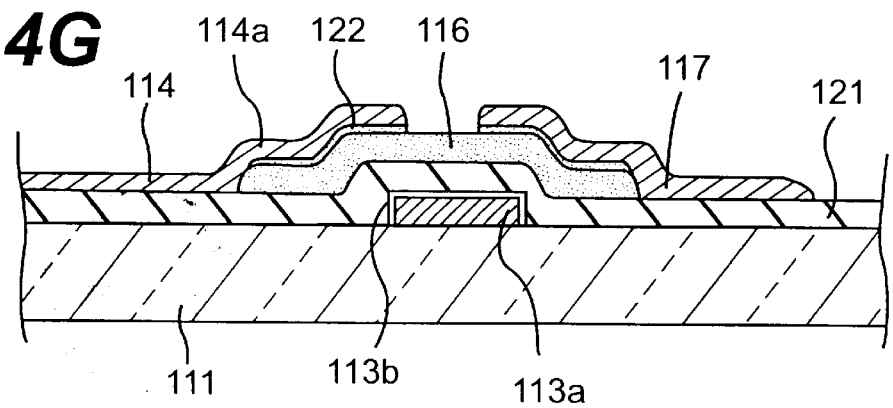
Figure 5A:
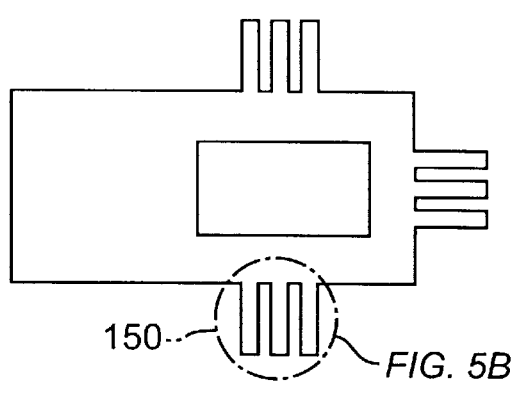
FIG. 5A is a diagram showing a mask having line-and-space patterns used in the manufacturing process depicted in FIGS. 4A—4I.

A second metal layer 146 made of a material selected from Al and Al alloys such as Al—Pd, Al—Si, Al—Si—Ti and Al—Si—Cu is formed with a 4,000 Å thickness using sputtering, and a photo-resist 156 is coated thereon (FIG. 4F). The second metal layer 146 is etched after the photo-resist is exposed and developed by using a mask having line-and space patterns on its border (FIG. 4G) so as to form a gradually tapered edge, e.g., see FIG. 6B. Each space between the lines in the pattern is selected to be smaller than the resolution of an exposure system, as shown in FIG. 5A. In this manner, a source bus line 114, a source electrode 114a, and a drain electrode 117 are formed.

It is preferable to use a mask having a line-and-space pattern on its border, in which each space between two adjacent lines is less than 2 μm, because commonly-used exposure systems have a resolution of 3–4 μm {e.g., FX-510D, an exposure system of NIKON in Japan, has a resolution of 2.4 μm (independent) 3 μm (L/S)}.

Figure 4H:
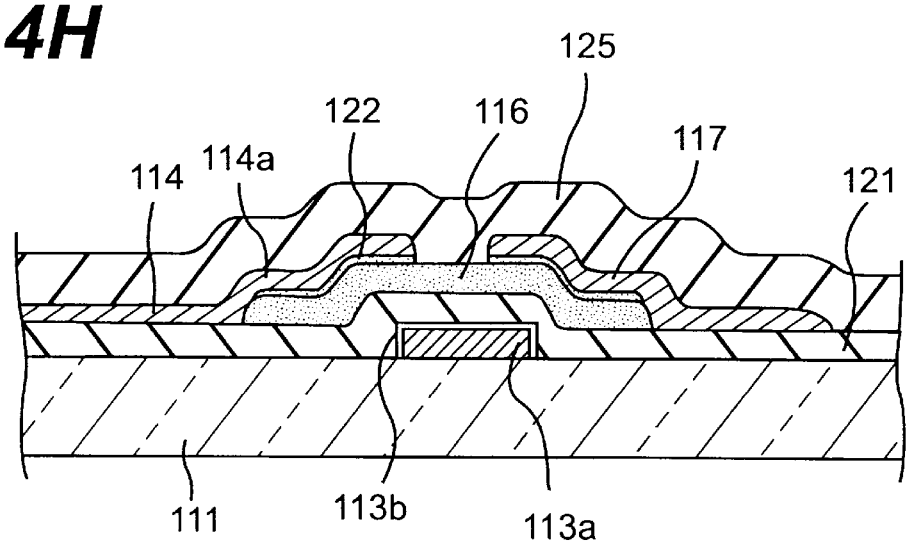
Figure 6A:
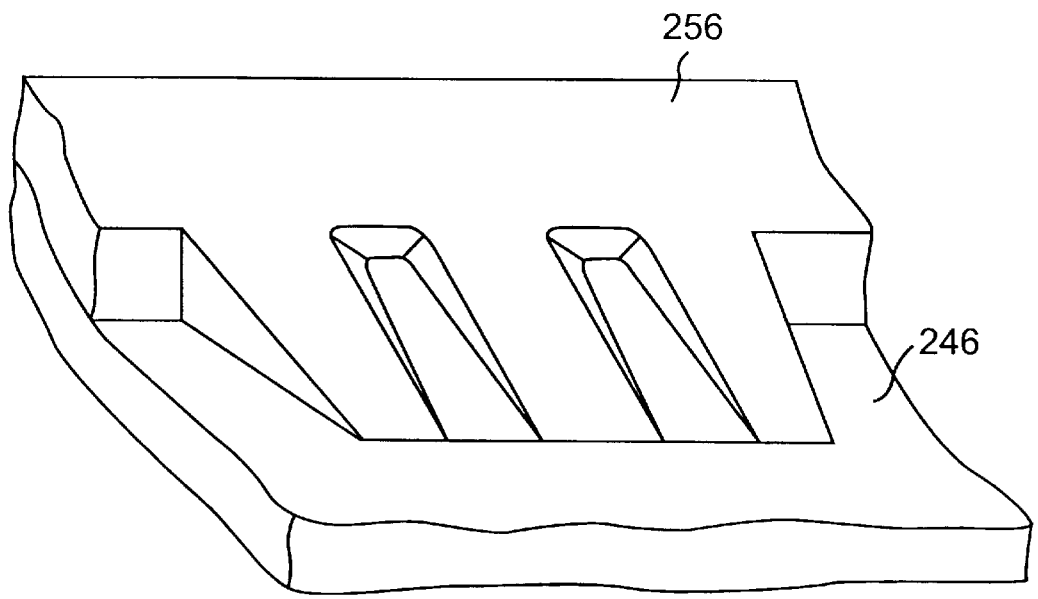
FIG. 6A is a model picture showing a pattern of a photo-resist on a metal layer of TFTs remaining after the photo-resist is exposed and developed by using the mask as shown in FIG. 5A according to the present invention.
Figure 6B:
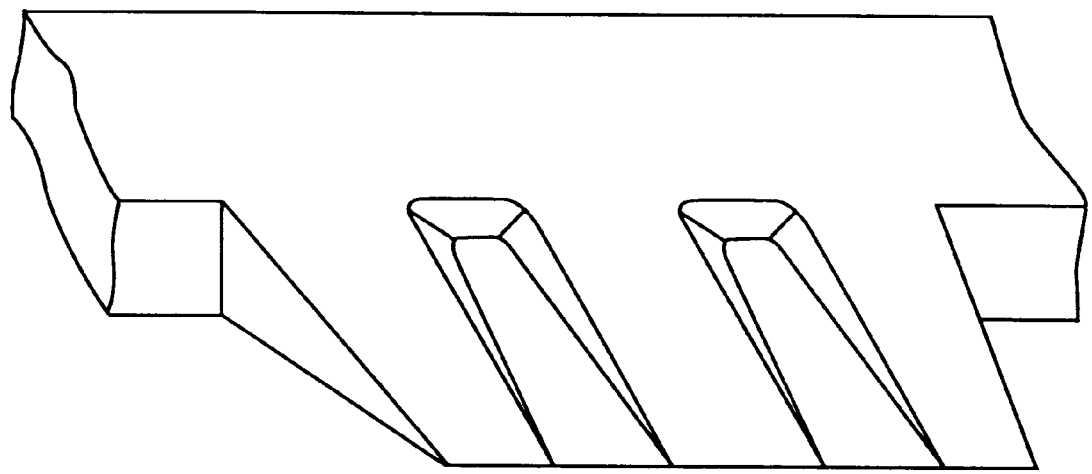
FIG. 6B is a model picture showing a pattern of a metal layer after etching step.

A passivation layer 125 is formed on the surface including the source bus line 114, source electrode 114a and the drain electrode 117, which have a furrow-and-ridge shape (FIG. 4H and FIG. 6B). Then, the passivation layer 125 also has a furrow-and-ridge shape with a gentle slope.

Figure 4I:
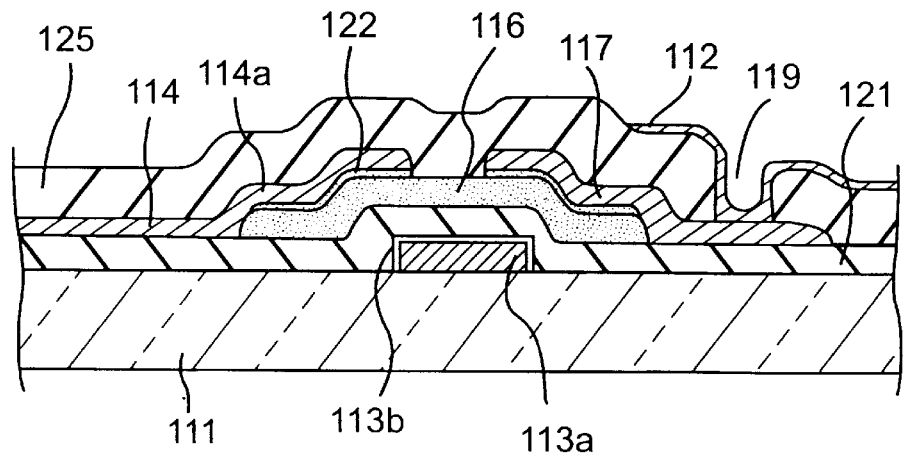

Next a photo-resist is coated, exposed and developed on the passivation layer 125. A contact hole 119 is formed by etching the passivation layer 125. A pixel electrode 112 (e.g., formed with ITO or other transparent conduction material) is formed by using a sputtering process, which makes contact with the drain electrode 117 through the hole 119 (FIG. 4I).

A first portion of the photo-resist corresponding to each space between the lines is lightly exposed due to the lines between the spaces, whereas a second portion of the photo-resist not covered by the mask at all is completely exposed. Therefore, about 10% of the first portion of the photo-resist remains after the exposed portions of the photo-resist are removed. A third portion of the photo-resist covered with each line of the mask is lightly exposed (and removed). That is, about 90% (maybe smaller at the edge of each line) of the third portion of the photo-resist remains after the exposed portions are removed.

In the etching step, a second portion of the second metal layer having no photo-resist thereon is etched more quickly than a first portion of the second metal layer on which about 10% of the photo-resist remains, because it takes additional time for the etchant to pass through the photo-resist and reach the second metal layer. Likewise, a third portion of the second metal layer on which some photo-resist is removed is etched more quickly than a fourth portion of the second metal layer on which the bulk photo-resist remains. As a result, the portion of the second metal layer which is covered with the line-and-space patterned mask has a wave like, furrow-and-ridge shape with a gentle taper, and not a stepped shape.

The process in which the above-mentioned steps are applied to dry-etching is described below. A second portion of the second metal layer having no photo-resist thereon can be wholly etched by an etchant. A first portion of the second metal layer on which only a thin layer of the photo-resist remains, can be etched to have a tapering shape with a gentle slope. The etchant penetrates first the then portion of the metal layer, second the first portion of the metal layer having a thin layer of photo-resist and then a third portion of the second metal layer having a thick layer of photo-resist thereon, so that the second metal layer with a gradually decreasing slope is formed.

That is, edge portions of the second metal layer patterned by the above mentioned method have a gentle curve and gradually tapering ends, and the insulating layer formed thereon follows the shape of the patterned second metal layer. The passivation layer has a gentle slope without cracks so that a conductive layer (e.g., a pixel electrode for connecting with the drain electrode) covers the passivation layer with a desired shape with tempered slope.

Figure 5B:
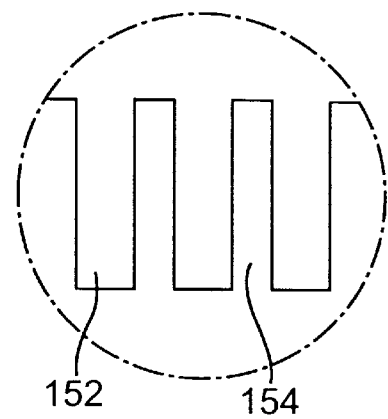
FIG. 5B is an enlarged view of a portion of the mask shown in FIG. 5A.

FIG. 5A shows a mask with a line-and-space pattern whose space width is smaller than a resolution of an exposure system using in the patterning process, and FIG. 5B is an enlarged view of the line-and-space pattern of the mask shown in FIG. 5A.

The line-and-space pattern 150 has teeth like ones in a comb and includes a plurality of lines 152 projecting from the border and spaces 154 between the lines 152. If necessary, the mask can have a plurality of line-and-space patterns formed on different portions of the border. Also, the line-and-space pattern can have a different shape, e.g., spaces and lines are formed inside the border of the mask.

FIG. 6A is a model picture showing a metal layer 246 having photo-resist 256 remaining after exposure and development by using the mask with the line-and-space pattern, e.g., shown in FIG. 5A, in which each space is smaller than a resolution of an exposure system.

Figure 7:
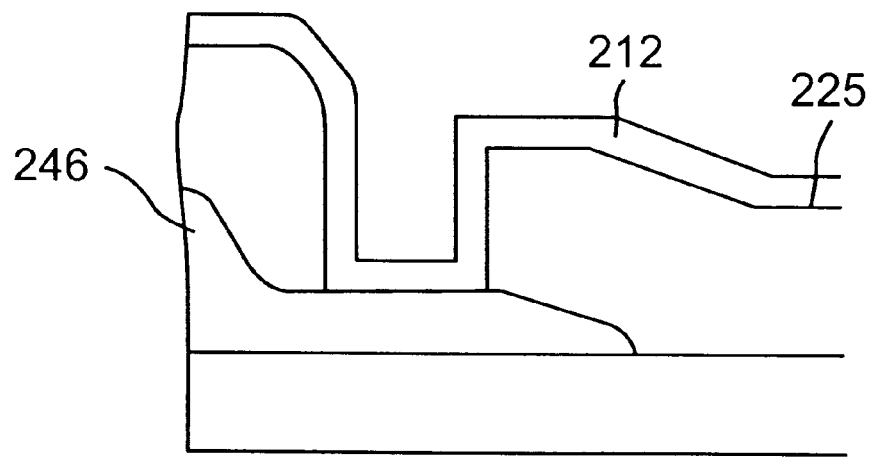
FIG. 7 is a cross-sectional view showing the improved step-coverage in a semiconductor device formed according to the present invention.

When a metal layer 246 is etched using the photo-resist 256 as described, the metal layer having a shape as shown in FIG. 6B is formed, wherein the edge of the metal layer 246 has a gentle curve. Consequently, an insulating layer 225 covering the metal layer 246, as shown in FIG. 7 also has a gentle slope. Any other layer (e.g., a pixel electrode 212) formed on the insulating layer 225 also has a gentle slope where the metal layer 246 ends.

When the above-method is applied to manufacturing LCDs in accordance with the embodiments of the present invention, a good step coverage can be obtained in a layered structure, and problems resulting from defects formed in signal lines of problems due to poor step coverage can be solved.

The present invention further prevents disconnection of signal lines at a step part by improving a step coverage of a cross-over layer. Although the present invention has been described as applicable to manufacturing LCDs, it can be applied to manufacturing other semiconductor products comprising cross-over layers.

The preferred embodiment of the present invention can use a positive and other photo-resist type. In the case that a negative photo-resist is used, the mask pattern which does not cover the exposed portion can be used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor device, comprising:

forming metal layer over a substrate;

forming a photo-resist pattern on the metal layer using a mask, the mask having at least one line-and-space pattern, the line-and-space pattern having a comb shape whose space width is smaller than a resolution of an exposure system; and patterning the metal layer using the photo-resist pattern so as to form a metal pattern having a gradually tapered ridge-and-furrow pattern.

2. A method according to claim 1, wherein the photo-resist pattern has a ridge-and-furrow shaped end portion.

3. A method according to claim 2, wherein the ridge-and-furrow shaped end portion of the photo-resist pattern gradually tapers.

4. A method according to claim 1, wherein the ridge-and-furrow pattern is formed on at least two sides of the drain electrode.

5. A method according to claim 1, wherein the line-and-space pattern has at least two protrusions.

6. A method for manufacturing a liquid crystal display, comprising:

forming a gate electrode on a substrate;

forming a gate insulating layer on the gate electrode;

forming a conductive material over the gate electrode;

forming a photo-resist pattern on the conductive material by using a mask having at least one line-and-space pattern whose space width is smaller than a resolution of an exposure system, the line-and-space pattern having a comb shape; and patterning the conductive material using the photo-resist pattern to form a drain electrode having a gradually tapered ridge and furrow pattern.

7. A method according to claim 6, further comprising:

forming a semiconductor layer on the gate insulating layer; and forming an impurity doped semiconductor layer on the semiconductor layer.

8. A method according to claim 7, further comprising:

forming a passivation layer on the drain electrode; and forming pixel electrode on the passivation layer so that the pixel electrode contacts the drain electrode.

9. A method according to claim 6, wherein the photo-resist pattern has a ridge-and-furrow shaped end portion.

10. A method according to claim 9, wherein the ridge-and-furrow shaped end portion of the photo-resist pattern gradually tapers.

11. A method according to claim 6, wherein the ridge-and-furrow pattern is formed on at least two sides of the drain electrode.

12. A method according to claim 6, wherein the line-and-space pattern has at least two protrusions.

* * * * *